United States Patent
Madhu et al.

(10) Patent No.: US 6,225,824 B1
(45) Date of Patent: *May 1, 2001

(54) HIGH SPEED OUTPUT BUFFER FOR HIGH/LOW VOLTAGE OPERATION

(75) Inventors: R Madhu; Abhijit Ray, both of Bangalore Karnataka (IN)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/264,433

(22) Filed: Mar. 8, 1999

(51) Int. Cl.[7] ................. H03K 19/02; H03K 19/0175; H03K 19/003
(52) U.S. Cl. ................. 326/58; 326/86; 326/27
(58) Field of Search ................. 326/86, 80, 81, 326/26, 27, 17, 83, 56–58

(56) References Cited

U.S. PATENT DOCUMENTS

| | | | |
|---|---|---|---|
| 4,988,888 | * 1/1991 | Hirose et al. | 326/27 |
| 5,153,457 | * 10/1992 | Martin et al. | 326/84 |
| 5,173,627 | * 12/1992 | Lien | 326/57 |
| 5,497,113 | * 3/1996 | Uber | 327/170 |
| 5,877,638 | * 3/1999 | Lin | 327/108 |
| 5,898,321 | * 4/1999 | Iikbahar et al. | 326/87 |

* cited by examiner

Primary Examiner—Michael Tokar
Assistant Examiner—James H. Cho
(74) Attorney, Agent, or Firm—Wade James Brady, III; Frederick J. Telecky, Jr.

(57) ABSTRACT

An output buffer (500) is disclosed that includes an output driver circuit (508) having a first drive transistor (P504) for driving an output node (520) to a first logic level according the potential at a first pre-drive node (516), and a second drive transistor (N504) for driving the output node (520) to a second logic level according the potential at a second pre-drive node (518). The potential at the first pre-drive node (516) is established by a first standard pre-drive circuit (504) and a first phased pre-drive circuit (512). The potential at the second pre-drive node (518) is established by a second standard pre-drive circuit (506) and a second phased pre-drive circuit (514). In a low voltage mode of operation, where the rate of current drawn (di/dt) by the output driver circuit (508) is reduced, the standard and phased pre-drive circuits (504, 506, 512, 514) function together to drive their respective pre-drive nodes. In a high voltage mode of operation, where output driver circuit (508) di/dt is increased, the phased pre-drive circuits (512 and 514) are enabled a predetermined delay after the standard pre-drive circuits (504 and 506).

21 Claims, 4 Drawing Sheets

HIGH SPEED OUTPUT BUFFER FOR HIGH/LOW VOLTAGE OPERATION

This application claims priority under 35 USC §119(e)(1) of application 09/264,433 filed Mar. 8, 1999.

TECHNICAL FIELD

The present invention relates generally to semiconductor integrated circuit devices, and more particularly to output buffer circuits for use in such devices.

BACKGROUND OF THE INVENTION

While various improvements in design approaches and manufacturing methods have led to increases in the speed at which data is processed within an integrated circuit, an important part of an integrated circuit's function continues to be how internal data signals are translated into output data signals for use by other devices. The propagation of data signals within an integrated circuit occurs on conductive lines of relatively small dimensions. Thus, the electrical loads presented by the internal conductive lines can be driven with relatively small transistors that draw small amounts of current. This is in contrast to the propagation of signals external to the integrated circuit device. In order to transmit data signals externally, an integrated circuit must drive a much larger capacitive and inductive load. The external load typically includes a bond wire that carries the electrical signal from the integrated circuit to a conductive lead frame. The lead frame provides the conductive leads (or pins) of the integrated circuit package. When the integrated circuit is use, the package pin will be electrically connected to other lines in an electronic system (e.g., soldered to a conductive line on a printed circuit board).

In order to ensure that the relatively large external loads are driven rapidly between various voltage levels, an integrated circuit typically includes an output buffer circuit for each output signal. Output buffer circuits include large semiconductor circuit elements that are capable of providing ("sourcing" or "sinking") the relatively large amounts of current required to rapidly charge and discharge the external loads, and thereby generate an output signal.

Figure 1:
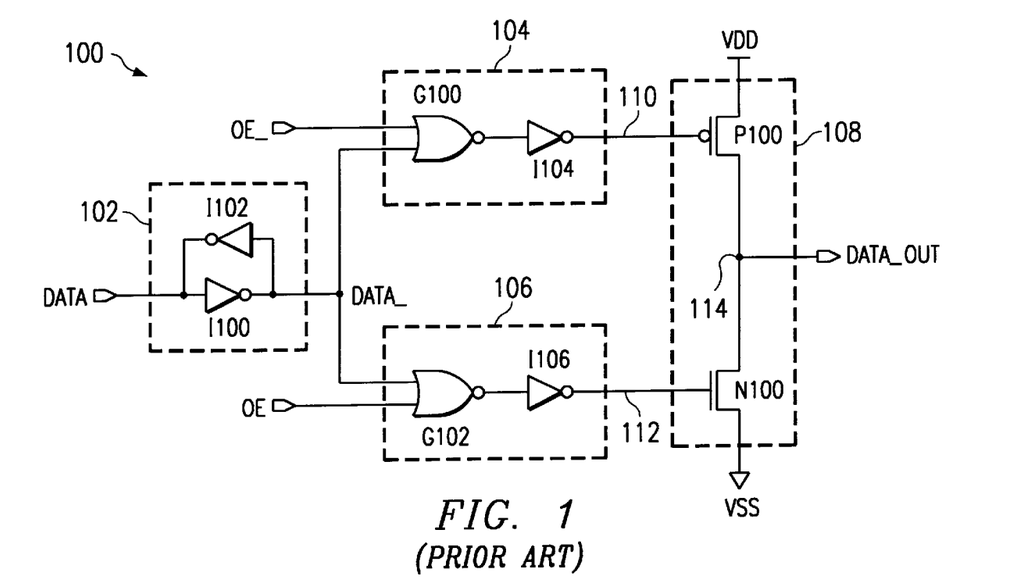
FIG. 1 is a schematic diagram of a first prior art output buffer circuit.

An example of a prior art output buffer circuit is set forth in a schematic diagram in FIG. 1. The output buffer circuit is designated by the general reference character 100, and is shown to include an input latch 102, a first pre-drive circuit 104, a second pre-drive circuit 106 and an output driver circuit 108. The input latch 102 includes two cross-coupled inverters I100 and I102. The input latch 102 receives an input data signal (DATA), and latches the value to provide an inverse data signal (DATA_) to the first and second pre-drive circuits (104 and 106).

The first pre-drive circuit 104 receives the DATA_ signal and an output enable signal (OE_), and in response to these signals, drives a first pre-drive node 110 between a high pre-drive potential and a low pre-drive potential. When the OE_ signal is high, the first pre-drive circuit 104 is disabled, and the first pre-drive node 110 is driven to a disable (high) potential. When the OE_ signal is low, the first pre-drive circuit 104 is enabled, and the first pre-drive node 110 voltage will follow from the DATA signal value. When the DATA_ signal is high, first pre-drive node 110 will be driven high. When the DATA_ signal is low, the first pre-drive node 110 will be driven low. The first pre-drive circuit 104 includes a two-input NOR gate G100 that receives the OE_ signal and the DATA_ signal as inputs. The output of gate G100 is provided as an input to an inverter I104. The output of inverter I104 drives the first pre-drive node 110.

The second pre-drive circuit 106 receives the DATA_ signal and a second output enable signal OE. The signal OE is the inverse of the OE_ signal. In response to the DATA_ and OE signal, the second pre-drive circuit 106 drives a second pre-drive node 112 between a enabling (high) pre-drive potential and a disabling (low) pre-drive potential. In a similar fashion to the first pre-drive circuit 104, when the OE signal is low, the second pre-drive circuit 106 is disabled, and the second pre-drive node 112 is driven low. When the OE signal is high, the second pre-drive circuit 106 is enabled, and the second pre-drive node 112 voltage will follow the DATA_ signal value. The second pre-drive circuit 106 includes a two-input NAND gate G102 that receives the OE signal and the DATA_ signal as inputs. The output of gate G102 is provided as an input to an inverter I106. The output of inverter I106 drives the second pre-drive node 112.

The output driver circuit 108 drives an output node 114 to either a high supply voltage (VDD) or a low supply voltage (VSS) depending upon the potential at the first pre-drive node 110 and second pre-drive node 112. The output driver circuit 108 includes p-channel metal-oxide-semiconductor (MOS) transistor P100 having a source-drain path connected between the VDD voltage and the output node 114. The gate of transistor P100 is coupled to the first pre-drive node 110. In a similar fashion, an n-channel MOS transistor N100 has a source-drain path connected between the output node 114 and the VSS voltage. The gate of transistor N100 is driven by the second pre-drive node 112. The output node 114 provides a data output signal DATA_OUT.

Figure 2:
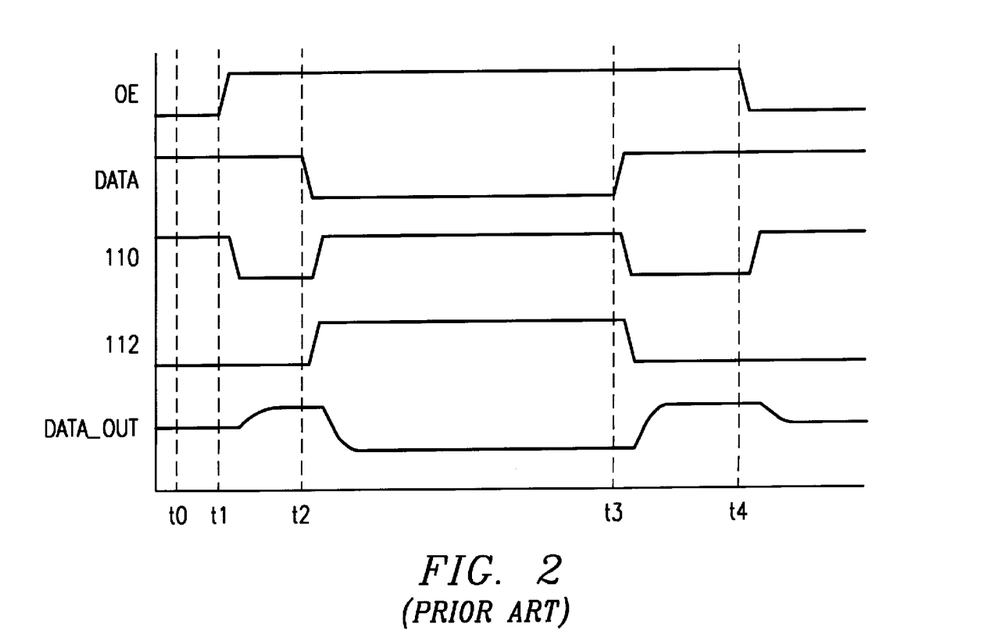
FIG. 2 is a timing diagram illustrating the operation of the prior art output buffer circuit of FIG. 1.

The operation of the prior art output buffer circuit 100 is best understood with reference to FIG. 2 in conjunction with FIG. 1. FIG. 2 is a timing diagram illustrating the OE signal, the DATA signal, and the DATA_OUT signal. In addition, the response of the first pre-drive node 110 and the second pre-drive node 112 are also set forth as waveforms "110" and "112" respectively.

Referring now to FIG. 2 in conjunction with FIG. 1, at time t0 the OE signal is low (and the OE_ signal is high), disabling the output driver circuit 100. The first pre-drive circuit 104 drives the first pre-drive node 110 high, turning off transistor P100. In the same fashion, the second pre-drive circuit 106 drives the second pre-drive node 112 low, turning off transistor N100.

At time t1, the OE signal transitions high (forcing OE_ low), and thereby enabling the output buffer circuit 100. The high DATA signal propagates through the input latch 102 driving the DATA_ signal low. With the OE_ and DATA_ signals low, the output of gate G100 is driven high. Inverter I104 drives the first pre-drive node 110 low, turning on transistor P100. In this manner, the DATA_OUT signal is driven high to the VDD voltage. At the same time, the low DATA_ signal and high OE signal are received by the second pre-drive circuit 106. The output of gate G102 remains high, and inverter I106 maintains the second pre-drive node 112 low, keeping transistor N100 off.

At time t2, with the OE signal still high, the DATA signal makes a first transition from high to low. The input latch 102 drives the DATA_ signal high. The high DATA_ signal results in the output of gate G100 going low, and inverter I104 drives the first pre-drive node 110 high. Transistor P100 is turned off, isolating the output node 114 from the VDD voltage. At the same time, with the OE and DATA_ signals high, the output of gate G102 is driven low, and inverter I106 drive the second pre-drive node 112 high, turning on transistor N100. The output node 114 is thus coupled to the VSS voltage, driving the DATA_OUT signal low.

At time t3, the DATA signal makes a second transition from low to high. The input latch 102 drives the DATA_ signal low. With a low DATA_ signal and a low OE_ signal, the output of gate G100 is driven high once more, and inverter I104 drives the first pre-drive node 110 low. Transistor P100 is turned on, and the DATA_OUT signal is driven high once again. At the same time, as the DATA_ signal goes low at the input of gate G102, the output of gate G102 is driven high, resulting in transistor N100 being turned off.

At time t4, the OE signal returns low, placing the output buffer circuit 100 in the disabled state once again. As described for time t0, the first pre-drive node 110 is driven high, turning off transistor P100, and the second pre-drive node 112 is driven low, turning off transistor N100.

In the prior art example of FIG. 1, transistors P100 and N100 are very large devices that are capable of rapidly drawing or discharging current to thereby drive the output node 114 between logic values. A drawback to the prior art circuit of FIG. 1 can arise out of the inherent inductance presented by the output load coupled to the output node 114. As transistors P100 and N100 switch on and off, the rate at which current is drawn through the load (the "di/dt") can be considerable. The di/dt in conjunction with inherent load inductance and supply line inductance can generate undesirable voltage changes at the output node 114 (often referred to as "ground bounce" or "supply bounce"). The supply line inductance typically arises from the portions of the lead frame that supply the power supply voltages (VCC and VSS) to the integrated circuit.

Figure 3:
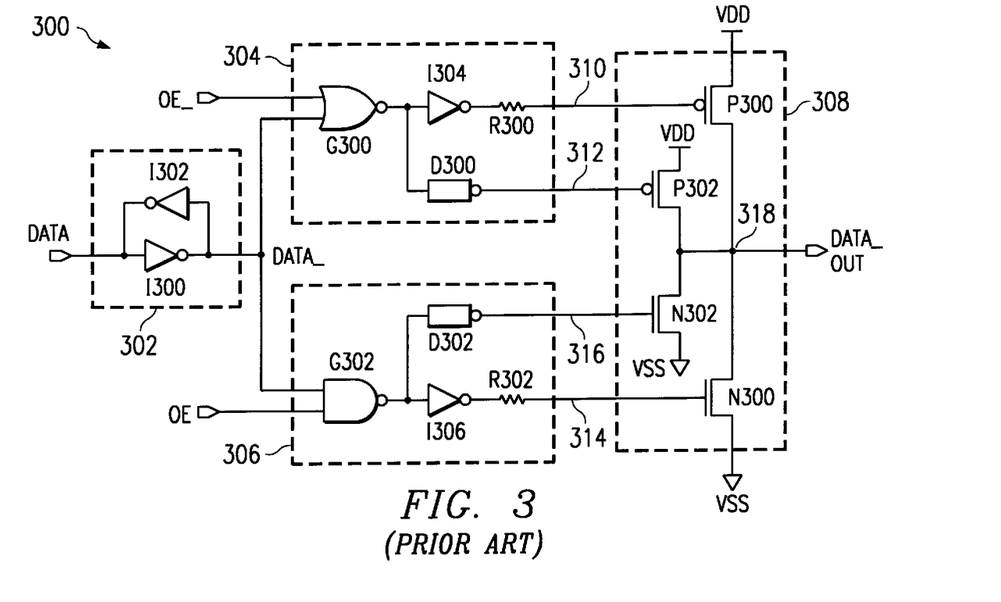
FIG. 3 is a schematic diagram of a second prior art output buffer circuit.

A second prior art example, set forth in FIG. 3, illustrates an output buffer circuit that can reduce ground bounce by dividing the output driving action into a first driving action followed by a second, subsequent driving action. The second prior art output buffer circuit is designated by the general reference character 300, and is shown to include an input latch 302, a first pre-drive circuit 304, a second pre-drive circuit 306, and an output driver circuit 308. Like the circuit of FIG. 1, the input latch 302 includes two cross-coupled inverters I300 and I302 that receive and latch an input data signal (DATA), to provide an inverse data signal (DATA_) for use by the first and second pre-drive circuits (304 and 306).

Unlike the first and second pre-drive circuits (104 and 106) of FIG. 1, which each drive a single pre-drive node, the first and second pre-drive circuits (304 and 306) of FIG. 3, each drive two pre-drive nodes. As shown in FIG. 3, the first pre-drive circuit 304 drives a first pre-drive node 310 and a second pre-drive node 312. Likewise, the second pre-drive circuit 306 drives a third pre-drive node 314 and a fourth pre-drive node 316. In operation, each pre-drive circuit (304 and 306) will drive one of its pre-drive nodes first, and then following a delay, will drive the other pre-drive node. In particular, when the DATA signal goes high, the first pre-drive circuit 304 will drive the first pre-drive node 310 low, and then following a delay, drive the second pre-drive node 312 low. When the DATA signal goes low, the second pre-drive circuit 306 will first drive the third pre-drive node 314 high, and then following a delay, drive the fourth pre-drive node 316 high.

The first pre-drive circuit 304 is shown to include a two-input NOR gate G300 that receives an output enable signal OE_ and the DATA_ signal. The output of gate G300 is connected to the first pre-drive node 310 by way of an inverter I304 and a resistor R300. In addition, the output of gate G300 is connected to the second pre-drive node 312 by a first inverting delay circuit D300. The inverting delay circuit D300 inverts and delays the output of gate G300. The second pre-drive circuit 306 includes a two-input NAND gate G302 that receives an output enable signal OE and the DATA_ signal. The output of gate G302 is connected to the third pre-drive node 314 by an inverter I306 and a resistor R302. The output of gate G302 is also connected to the fourth pre-drive node 316 by a second inverting delay circuit D302.

The output driver circuit 308 drives an output node 318 between a high supply voltage VDD and low supply voltage VSS to generate a data output signal DATA_OUT. Unlike the circuit of FIG. 1, which drives its output node 114 high by a single charge path (the source-drain path of transistor P100), the output driver circuit 300 of FIG. 3 drives the output node 318 high with two charge paths. A first path is created by a first p-channel MOS drive transistor P300 which is controlled by the potential at the first pre-drive node 310. A second path is created by a second p-channel MOS drive transistor P302 which is controlled by the potential at the second pre-drive node 312. The output driver circuit 308 includes two discharge paths as well. A first discharge path is provided by an n-channel third drive transistor N300 which is controlled by the potential at the third pre-drive node 314. A second discharge path is created by an n-channel fourth drive transistor N302 which is controlled by the potential at the fourth pre-drive node 316.

Figure 4:
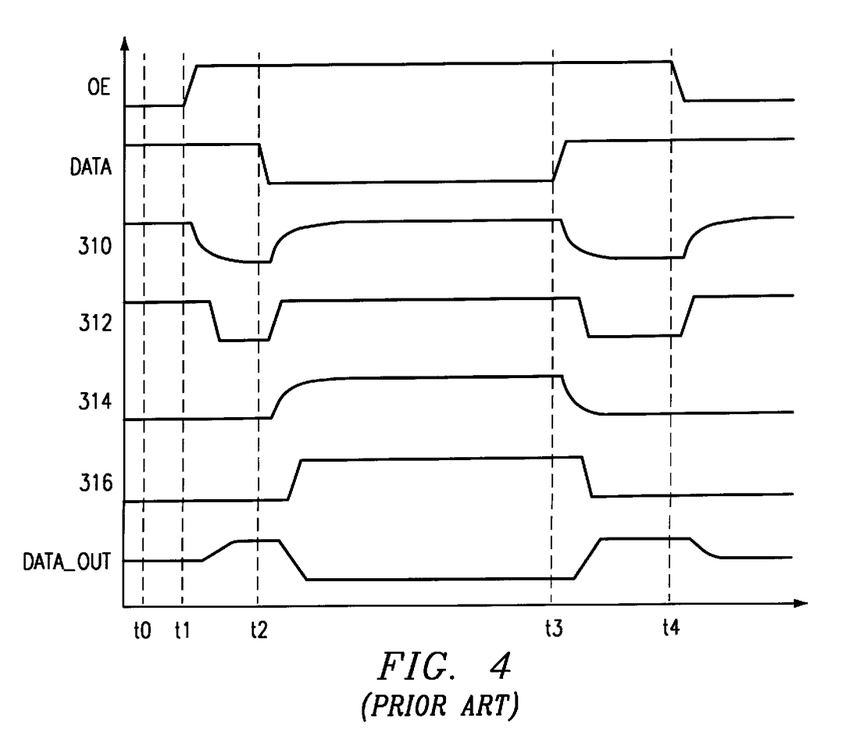
FIG. 4 is a timing diagram illustrating the operation of the prior art output buffer circuit of FIG. 3.

The operation of the output buffer circuit 300 is described by a timing diagram in FIG. 4. FIG. 4 illustrates an OE signal, a DATA signal, and a DATA_OUT signal. In addition, the resulting responses of the first through fourth pre-drive nodes (310, 312, 314 and 316) are shown as waveforms "310," "312," "314" and "316," respectively.

Referring now to FIG. 4 in conjunction with FIG. 3, at time t0, the OE signal is low, resulting in the output buffer circuit 300 being disabled. The resulting high OE_ signal at the input of gate G300, forces the first and second pre-drive nodes (310 and 312) high, turning off transistors P300 and P302. Within the second pre-drive circuit 306, the low OE signal forces the output of gate G302 high. As a result, the third and fourth pre-drive nodes (314 and 316) are forced low, turning off transistors N300 and N302.

At time t1, the OE signal transitions high, enabling the output buffer circuit 300. With the OE_ signal now low and the DATA_ signal low, the output of gate G300 goes high. As a result, the first pre-drive node 310 will be driven low, turning on transistor P300. In this manner, current will begin flowing through transistor P300. The resistor R300 and size of transistor P300 helps reduce the rate at which the first pre-drive node 310 is charged, thereby reducing the magnitude of the di/dt generated when transistor P300 turns on.

Following the delay established by inverting delay circuit D300, the second pre-drive node 312 will be driven low, turning on transistor P302. Transistor P302 will then complete the charging of the output node 318. While transistors P300 and P302 turn on sequentially, the third and fourth pre-drive nodes (314 and 316) remain low, keeping transistors N300 and N302 turned off.

At time t2, the DATA signal makes a first transition from a high logic value to a low logic value. The input latch 302 latches the new DATA signal value, driving the DATA_ signal high. The high DATA_ signal is applied to the first pre-drive circuit 304, driving the output of gate G300 low.

The first pre-drive node 310 is driven high, turning off transistor P300. Likewise, the second pre-drive node 312 is subsequently driven high by delay circuit D300, causing transistor P302 to turn off.

At the same time, the high DATA_ signal, in combination with the high OE signal, results in the output of gate G302 being driven low. The third pre-drive node 314 is driven high, turning on transistor N300 to begin driving the output node 318 low. Resistor R302 and the size of transistor N300 limit the rate at which the third pre-drive node is discharged, thereby reducing the di/dt caused by transistor N300. Following a delay established by inverting delay circuit D302, transistor N302 turns on, completing the discharge of the output node 318. In this manner, the DATA_OUT signal is driven low in response to a low DATA signal input.

At time t3, the DATA signal makes a second transition from low to high. The input latch 302 latches the new data value forcing the DATA_ signal low. With the DATA_ signal low and the OE_ signal low, the first pre-drive node 310 is driven low once again, turning on transistor P300. The output node 318 will begin charging, but at a reduced di/dt rate. After the delay established by delay circuit D300, the second pre-drive node 312 is driven low and transistor P302 will turn on, further charging the output node 318. At the same time, the second pre-drive circuit 306 will drive the third pre-drive node 314 and fourth pre-drive node 316 low, turning off transistors N300 and N302. In this manner, the DATA_OUT signal is driven high in response to a high DATA signal input.

At time t4, the OE signal falls, disabling the output driver circuit 300. The high OE_ signal and low OE signal result in the outputs of gates G300 and G302 being low and high, respectively, regardless of the DATA_ value. As a result, transistors P300, P302, N300 and N302 are all turned off, allowing the output node 318 to float in a high impedance state.

While the prior art output buffer circuit of FIG. 3 can reduce di/dt values required to rapidly drive the output node 318, the output buffer circuit can require considerable area, as four large driver transistors (P300, P302, N300 and N302) are required.

Other output driver circuits, having only two driver devices, have managed to reduce di/dt values, by carefully biasing the pre-drive nodes that control the driver devices. Such an approach requires complex biasing circuits, and so can be difficult to implement. In addition, such biasing circuits may also require substantial increases in the amount of area required.

A further factor can contribute to the difficulties of implementing output buffer circuits. This factor is the desire to have integrated circuits operate at more than one power supply voltage. For example, many integrated circuit devices may be designed to operate at a first "high" power supply voltage of five volts as well as a "low" power supply voltage, such as 3.3 volts. An output buffer circuit that may operate at one power supply voltage with sufficient speed and low di/dt response, may not be appropriate for another power supply voltage. In particular, the output buffer circuit 100 of FIG. 1 may function adequately at a low power supply voltage. The low VDD value will result in lower di/dt magnitudes when the drive transistors (N100 and P100) switch on and off. However, were the power supply raised to a higher level, the resulting higher VDD value could cause the di/dt values to increase thereby introducing supply bounce. Similarly, the output buffer circuit 300 of FIG. 3 may function well at a high power supply voltage by reducing the resulting di/dt as previously described. However, at a low power supply voltage the output buffer circuit 300 may be too slow, taking too long to drive the output node 318 between the smaller VDD voltage and VSS voltage.

It would be desirable to have an output buffer circuit that provides a high operating speed and low di/dt response for both a high and a low supply voltage level. At the same time, it would be desirable to do so without requiring overly complex timing circuits or additional area for the implementation of a large number of output drive devices.

SUMMARY OF THE INVENTION

According to the preferred embodiment, an output buffer circuit includes an output driver stage having a pull-up device controlled by the potential at a first pre-drive node, and a pull-down device controlled by the potential at a second pre-drive node. The potentials at the pre-drive nodes are each controlled by standard pre-drive circuit and a phased pre-drive circuit. When the output buffer circuit operates with a low power supply voltage, the standard and phased pre-drive circuits operate together to rapidly drive their respective pre-drive nodes, and hence rapidly turn the pull-up and pull-down devices on and off. At a high power supply voltage, where the rate of current drawn by the pull-up and pull-down devices is of concern, the standard pre-drive circuits are first enabled, and drive their respective pre-drive node at a slower rate. Following a delay, the phased pre-drive circuits are enabled, and rapidly drive the pre-drive node to a full logic level. The phased operation of the standard and phased pre-drive circuits at high voltages reduces the rate at which current is drawn by the pull-up and pull-down devices.

DETAILED DESCRIPTION OF THE EMBODIMENTS

The preferred embodiment is an output buffer circuit for driving an output node in response to an input data signal. The output buffer circuit includes a first drive device that drives the output node to a first voltage according to the potential at a first pre-drive node, and a second drive device that drives the output node to a second voltage according to the potential at a second pre-drive node. The potential at each pre-drive node is controlled by a pair of pre-drive devices. The preferred embodiment includes a standard mode of operation, for low power supply voltages, in which the two pre-drive devices are activated together, to rapidly drive a given pre-drive node, and thereby enable one of the drive devices. In addition, a phased mode of operation is included for high power supply voltages. In the phased mode of operation, a first pre-drive device is enabled, to begin to turn on its associated drive device for a lower current rate (di/dt) response. Subsequently, the second pre-drive device will turn on to complete the driving action at the pre-drive node.

Figure 5:
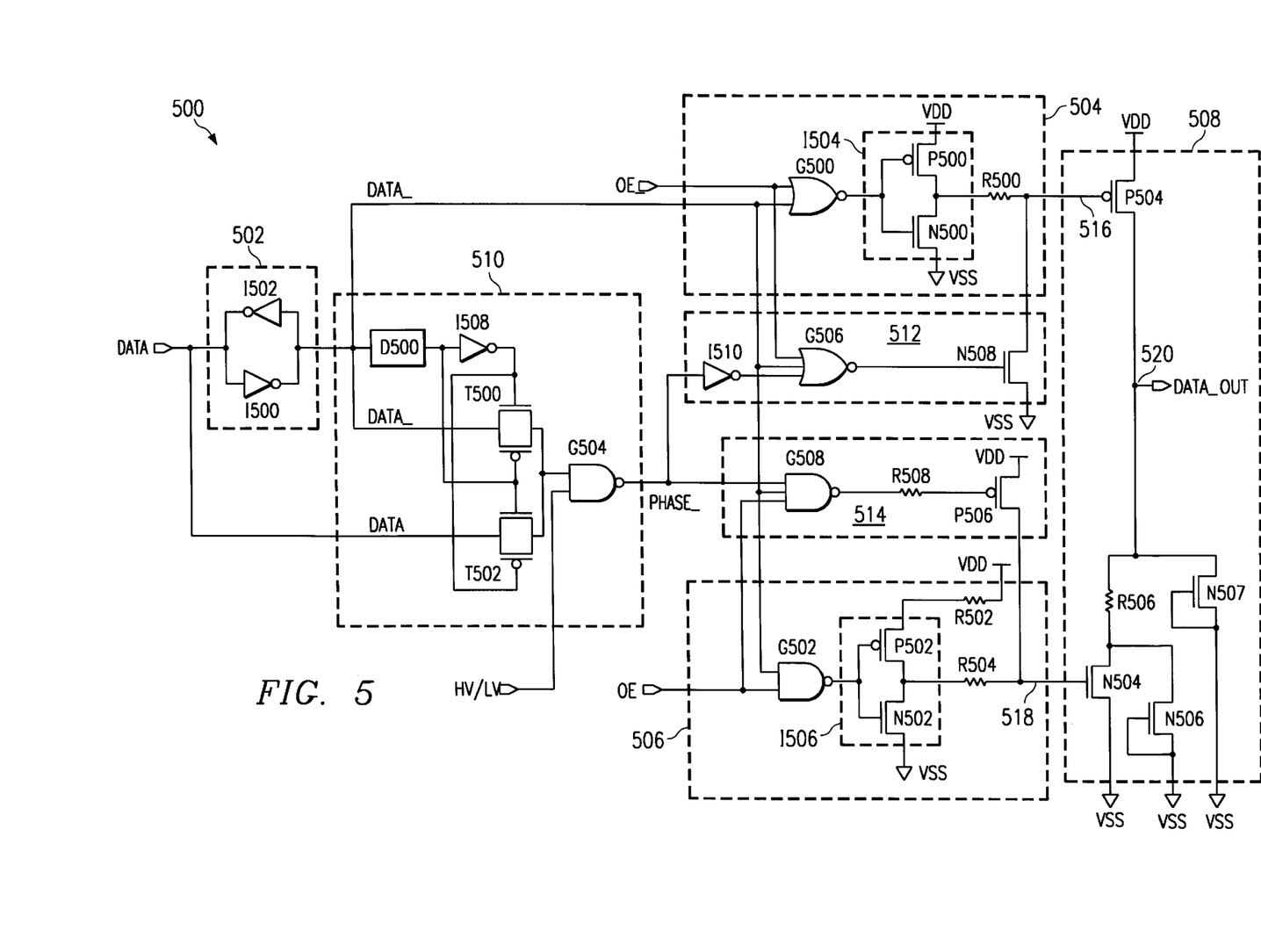
FIG. 5 is a schematic diagram of a preferred embodiment.

The preferred embodiment is set forth in a schematic diagram in FIG. 5, and is designated by the general reference character 500. The preferred embodiment 500 can be conceptualized as including an input latch 502, a first standard pre-drive circuit 504, a second standard pre-drive circuit 506, and an output driver circuit 508. In addition, the preferred embodiment 500 also includes a phase control circuit 510, a first phased pre-drive circuit 512, and a second phased pre-drive circuit 514.

The input latch 502 includes a pair of cross-coupled inverters I500 and I502, and serves to latch the value of an input data signal (DATA) to provide an inverse input data signal (DATA_). The DATA signal is also applied to the phase control circuit 510. The DATA_ signal is provided as an input to the first and second standard pre-drive circuits (504 and 506), as well as the first and second phased pre-drive circuits (512 and 514).

In addition to the DATA_ signal, the first standard pre-drive circuit 504 receives an output enable signal OE_. Provided the OE_ signal is active (low), the first standard pre-drive circuit 504 will be enabled, and will drive a first pre-charge node 516 according to the value of the DATA_ signal. Thus, if the OE_ signal is low and the DATA_ signal is low, first pre-drive node 516 will be driven to an enabling potential (low). If the OE_ signal is low and the DATA_ signal is high, the first drive node 516 will be driven to a disabling potential (high). In the event the OE_ signal is inactive (high), the first pre-drive node 516 will be driven to the disabling regardless of the value of the DATA_ signal.

The first standard pre-drive circuit 504 of the preferred embodiment 500 is shown to include a two input NOR gate G500 that receives the OE_ signal as one input and the DATA_ signal as another input. The output of gate G500 drives a complementary metal-oxide-semiconductor (CMOS) inverter I504 formed by p-channel MOS transistor P500 and n-channel MOS transistor N500. The output of inverter I504 drives the first pre-drive node 516 by way of first resistor R500. The impedance provided by resistor R500 limits the speed at which the first pre-drive node 516 can be driven by inverter I504. Transistor N500 can be conceptualized as being a first standard pre-drive device, as it is the enabling of this transistor which establishes the enabling (low) potential at the first pre-drive node 516.

The second standard pre-drive circuit 506 receives an output enable signal OE (that is the inverse of the OE_ signal) and the DATA_ signal, and drives a second pre-drive node 518 in response thereto. Like the first standard pre-drive circuit 504, the second standard pre-drive circuit 506 is enabled or disabled according to its respective output enable signal (OE). When the OE signal is high, the second standard pre-drive circuit 506 is enabled, and will drive the second pre-drive node 518 to an enable potential (high) if the DATA_ signal is high, and to a disable potential (low) if the DATA_ signal is low. In the event the OE signal is low, the second pre-drive circuit 506 will be disabled, and drive the second pre-drive node 518 low, regardless of the DATA_ signal value.

The second standard pre-drive circuit 506 is shown to include a two input NAND gate G502 that receives the OE and DATA_ signals as inputs. The output of gate G502 drives a CMOS inverter I506 that includes p-channel MOS transistor P502 and n-channel MOS transistor N502. The source of transistor P502 is not coupled directly to the high power supply voltage VDD, but instead is coupled thereto by a second resistor R502. The output of inverter I506 is coupled to the second pre-drive node 518 by a third resistor R504. The impedance provided by resistor R504 limits the speed at which the second pre-drive node 518 can be driven between a high and low value by inverter I506. In addition, resistor R502 further limits the speed at which the second pre-drive node 518 can be driven to the enabling (high) potential. Transistor P502 can be conceptualized as being a second standard pre-drive device, as it is the enabling of this transistor which establishes the enabling (high) potential at the second pre-drive node 518.

The output driver circuit 508 drives an output node 520 between a first drive voltage (VDD) and a second drive voltage (VSS) according to the potential at the first and second pre-drive nodes (516 and 518). As the first pre-drive node 516 approaches the enabling potential, the output driver circuit 508 will drive the output node 520 high. As the second pre-drive node 518 approaches its enabling potential, the output driver 508 will drive the output node 520 low. Thus, the rate at which the first and second pre-drive nodes (516 and 518) are driven between high and low voltages will impact the rate at which the output node 520 is driven between the drive voltages VDD and VSS.

In the preferred embodiment 500, the output driver circuit 508 is shown to include a p-channel MOS first driver transistor P504 having a source-drain path arranged between the high power supply voltage VDD and the output node 520. An n-channel MOS second driver transistor N504 has a source-drain path arranged between the low power supply voltage VSS and the output node 520. The drain of transistor N504 is coupled the output node 520 by a fourth resistor R506. The output driver circuit 508 also includes an n-channel MOS first clamp transistor N506 and an n-channel MOS second clamp transistor N507. Transistor N506 is coupled in a diode configuration (i.e., its gate connected to its source) between the drain of driver transistor N504 and the low power supply voltage. Transistor N507 is similarly arranged between the output node 520 and the low power supply voltage VSS. Clamp transistors N506 and N507 serve the prevent the voltage at the output node 520 and/or the drain of driver transistor N504 from falling more than one threshold voltage below the VSS voltage.

As the potential at the first pre-charge node 516 begins to fall (is driven to an enabling potential), transistor P504 will begin to be enabled, and source current from the VDD voltage supply, thereby charging the output node 520. Thus, in the particular arrangement of FIG. 5, the rate at which the first pre-charge node 516 is discharged will determine the rate at which transistor P504 sources current (the di/dt of transistor P504). Similarly, as the potential at the second pre-charge node 518 begins to rise (approaches its enabling potential), transistor N504 will begin to turn on, and sink current to the VSS voltage supply, thereby discharging the output node 520. Thus, the rate at which the second pre-charge node 518 is charged will determine the rate at which transistor N504 sinks current (the di/dt of transistor N504).

Referring once again to FIG. 5, the phase control circuit 510, first phased pre-charge circuit 512, and second phased pre-charge circuit 514 will be described in more detail. In addition to receiving the DATA and DATA_ signals, the phase control circuit 510 also receives a supply voltage indication signal HV/LV_. A high HV/LV_ signal indicates that the output buffer circuit 500 is operating at a high supply voltage level. A low HV/LV_ signal indicates that the output buffer circuit 500 is operating at a low supply voltage level. In response to the DATA, DATA_ and HV/LV_ signals, the phase control circuit 510 provides a phase enable signal PHASE__. In a low voltage mode (i.e., HV/LV__ low), the PHASE__ signal is inactive, and remains high. In a high voltage mode (i.e., HV/LV__ high), the PHASE__ signal will be activated (be driven low) for a predetermined delay period whenever the DATA signal makes a transition. The activation of the PHASE__ signal serves to phase the operation of the first and second phased pre-drive circuits (512 and 514) with respect to the first and second standard pre-drive circuits (504 and 506).

In the preferred embodiment 500, the phase control circuit 510 includes a first and a second CMOS transmission gate (T500 and T502) and a two input NAND gate G504. Transmission gate T500 couples the DATA__ signal to a first input of gate G504, while transmission gate T502 couples the DATA signal to the same input of gate G504. The other input of gate G504 is the HV/LV__ signal.

Transmission gates T500 and T502 are enabled by a timing chain that is activated off of the DATA__ signal. The timing chain includes a delay circuit D500 in series with a timing inverter I508. The output of the delay circuit D500 drives the p-channel device of transmission gate T500 and the n-channel device of transmission gate T502. In a complementary fashion, the output of inverter I508 drives the p-channel device of transmission gate T502 and the n-channel device of transmission gate T500. In this arrangement, when the HV/LV__ signal is low, the PHASE__ signal will be forced high by gate G504. However, when the HV/LV__ signal is high, the PHASE__ signal will pulse low for a time period determined by the delay circuit D500 upon each transition in the DATA signal.

The first phased pre-drive circuit 512 assists in driving the first pre-drive node 516 to the enabling potential. Like the first and second standard pre-drive circuits (504 and 506), the first phased pre-drive circuit 512 is enabled and disabled by its associated output enable signal OE__. Thus, if the OE__ signal is high, the first phased pre-drive circuit 512 is disabled, and will not drive the first pre-drive node 516 to the enabling potential. In contrast, when the OE__ signal is low, the first pre-drive node 516 will be driven to the enabling potential according to the DATA__ signal value.

The timing of this first phased pre-drive circuit 512 function is dependent upon which mode (high voltage or low voltage) that the output buffer circuit 500 is operating in. In the low voltage mode, the first phased pre-drive circuit 512 will drive the first pre-drive node 516 to the enabling potential (i.e., low) at the same general time that the first standard pre-drive circuit 504 does. However, in the high voltage mode, where increases in the power supply voltage could translate into high di/dt levels, the first phased pre-drive circuit 512 will be disabled while the PHASE__ signal is active, and so will not begin to drive the first pre-drive node 516 low until a predetermined delay after the first standard pre-drive circuit 504 has started to drive the first pre-drive node 516 low. This arrangement limits di/dt values in the high voltage mode as the first standard pre-drive circuit 504 draws limited current while initially discharging the first pre-drive node 516 before the first phased pre-drive circuit 512 is enabled and completely discharges the first pre-drive node 516.

The first phased pre-drive circuit 512 of the preferred embodiment 500 is shown to include a three input NOR gate G506 that receives the OE__ and DATA__ signals as inputs. The third input is the PHASE__ signal as inverted by a phase input inverter I510. The output of gate G506 is coupled to an n-channel MOS first phased pre-drive transistor N508. The source-drain path of transistor N508 is coupled between the first pre-drive node 516 and the VSS voltage. Transistor N508 can be conceptualized as being a first phased pre-drive device, as it also establishes the enabling (low) potential at the first pre-drive node 516. Accordingly, in the arrangement of FIG. 5, in a low voltage mode, the first standard and phased pre-drive transistors (N500 and N508) are activated together. In a high voltage mode, however, the first phased pre-drive transistor N508 is activated after the first standard pre-drive transistor N500.

The second phased pre-drive circuit 514 assists in driving the second pre-drive node 518 to its enabling potential (high). Like other pre-drive circuits (504, 506 and 512), the second phased pre-drive circuit 514 is enabled and disabled by an associated output enable signal OE. When the OE signal is low, the second phased pre-drive circuit 514 is disabled, and will not charge the second pre-drive node 518. When the OE signal is high, the second pre-drive node 518 will charge the second pre-drive node 518 according to timing that depends upon the magnitude of the power supply voltage. If the output buffer circuit 500 is operating at a low power supply voltage, the second phased pre-drive circuit 514 will drive the second pre-drive node 518 high when the DATA signal transitions from high to low. If the output buffer circuit 500 is operating at a high power supply voltage, the second phased pre-drive circuit 514 will drive the second pre-drive node 518 high a given delay after the second standard pre-drive circuit 506 has started to drive the second pre-drive node 518.

The preferred embodiment 500 second phased pre-drive circuit 514 includes a three-input NAND gate G508 that receives the OE, DATA__, and PHASE__ signals as inputs. The output of the gate G508 drives the gate of a p-channel MOS second phased pre-drive transistor P506 by way of a phase resistor R508. The source-drain path of transistor P506 is coupled between the second pre-drive node 518 and the VDD voltage. Transistor P508 can be conceptualized as being a second phased pre-drive device, as it helps to establish the enabling (high) potential at the second pre-drive node 518. Accordingly, in the arrangement of FIG. 5, in a low voltage mode, the second standard and phased pre-drive transistors (P502 and P506) are activated together. In a high voltage mode, however, the second phased pre-drive transistor P508 is activated after the second standard pre-drive transistor P502.

Figure 6:
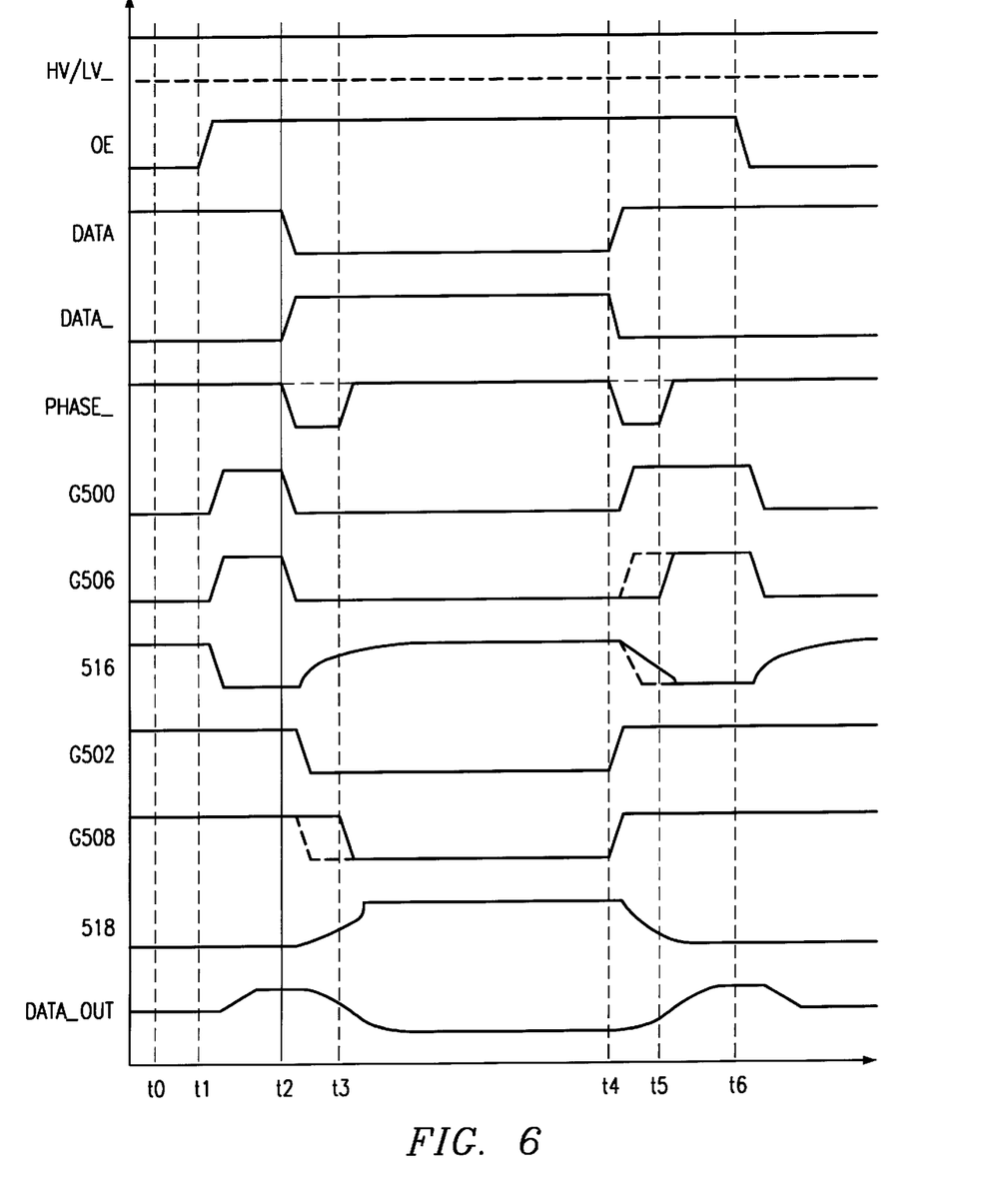
FIG. 6 is a timing diagram illustrating the operation of the preferred embodiment of FIG. 5.

The operation of the preferred embodiment 500 is best understood with reference to FIG. 6. FIG. 6 is a timing diagram illustrating the various input signals of the preferred embodiment, including the HV/LV__, OE, and DATA signals. In addition, the result of the output node 520 is shown as DATA_OUT. FIG. 6 also illustrates a number of nodes internal to the preferred embodiment, including the DATA__ signal, the PHASE__ signal, the response of the first pre-drive node 516, shown as waveform "516", and the response of the second pre-drive node 518, shown as waveform "518." Finally, to better understand the switching of devices within the standard pre-drive circuits (504 and 506) and phased pre-drive circuits (512 and 514) the output of gates G500, G506, G502 and G508 are illustrated as waveforms "G500," "G506," "G502" and "G508," respectively.

The waveforms of FIG. 6 illustrate the responses of various nodes in the high voltage mode and a low voltage mode. The high voltage mode response is shown as a solid line and the low voltage mode is shown as a dashed line.

Referring now to FIG. 6 in conjunction with FIG. 5, the operation of the preferred embodiment in the high voltage mode will first be described. At time t0, the HV/LV_ and DATA signals are high, while the OE signal is low. The high DATA signal results in the DATA_ signal being low. With the DATA_ signal low and HV/LV_ signal high, the PHASE_ signal is high. The low OE signal disables the standard pre-drive circuits (504 and 506) and phased pre-drive circuits (512 and 514), forcing the outputs of gate G500 and G506 low, and the outputs of gates G502 and G508 high. Inverter I504 drives the first pre-drive node 516 high, disabling driver transistor P504. Inverter I506 drives the second pre-drive node 518 low, disabling driver transistor N504. With transistors P504 and N504 turned off, the output node 520 floats in a high impedance state.

At time t1, with the HV/LV_ signal still high, the OE signal transitions high, enabling the output buffer circuit 500. The DATA signal remains high and the DATA_ signal remains low. With the DATA_ signal low, and the output buffer circuit 500 enabled, the first standard pre-drive circuit 504 and the first phased pre-drive circuit 512 drive the first pre-drive node 516 low. Transistor P504 is turned on, pulling the output node 520 to the VDD level. Within the second standard pre-drive circuit 506, the inverter I506 drives the second pre-charge node 518 low, maintaining transistor N504 off. Within the second phased pre-drive circuit 514 transistor P506 is also turned off.

At time t2, the DATA signal undergoes a first data transition, going from high to low. The DATA_ signal is driven high, resulting in the output of gate G500 and G506 both going low. Inverter I504 drives the first pre-drive node 516 high, turning off first drive transistor P504. Resistor R500 slows the rate at which the first pre-drive node 516 is charged, and thereby slows the rate at which first drive transistor P504 is turned off. Within the first phased pre-drive circuit 512 transistor N508 is turned off. In this manner, a high-to-low transition in the DATA signal results in the disabling of the first drive transistor P504.

At the same time, the DATA_ signal transition results in the output of gate G502 going low. Inverter I506 begins to drive the second pre-drive node 518 high, but at a relatively reduced rate. In this manner, the low-to-high DATA signal transition results in the second drive transistor N504 being initially turned on at a slower rate, resulting in a reduced di/dt magnitude at the output node 520. The high DATA_ signal is also applied to gate G508 within the second phased pre-drive circuit 514. However, because the PHASE_ signal is low, the second phased pre-drive circuit 514 is temporarily disabled, preventing the DATA_transition from propagating through to the gate of transistor P508. Thus, following the initial transition in the DATA_ signal, the output of gate G508 remains high and transistor P506 remains off.

At time t3, the PHASE_ signal pulse terminates, returning the PHASE_ signal to the high level. The second phased pre-drive circuit 514 is thus enabled, and transistor P506 is turned on to complete the charging of the second pre-drive node 518. In this manner, in a high voltage mode, when the DATA signal transitions from a high to low level, transistor P506 is phased to turn on after transistor P502, thereby limiting the resulting di/dt when transistor N504 within the output stage 508 is turned on.

At time t4, the DATA signal makes a second type of transition, going from low to high. Within the second standard and phased pre-drive circuits (506 and 514), the resulting low DATA_ signal drives the output of gates G502 and G508 high. Transistors P506 and P502 are turned off, while transistor N502 is turned on. The second pre-drive node 518 is discharged, turning off the second driver transistor N504 within the output driver circuit 508. Resistor R504 slows the rate at which the second pre-drive node 518 is discharged, and thereby slows the rate at which second drive transistor N504 is turned off. In this manner, a low-to-high transition in the DATA signal results in the disabling of the second drive transistor N504.

At the same time, the low-going DATA_ signal transition is applied to the first standard and phased pre-drive circuits (504 and 512). Within the first standard pre-drive circuit 504, the output of gate G500 goes high. Inverter I504 begins to discharge the first pre-drive node 516 to VSS. However, the discharge action occurs at a slower rate due to resistor R500, resulting first drive transistor P504 being turned on at a slower (and hence lower di/dt) rate. Within the phase control circuit 510, the low-to-high DATA signal transition generates a low-going PHASE_ pulse. When inverted by inverter I510, this PHASE_ pulse temporarily forces the output of gate G506 low, keeping transistor N508 turned off, and thereby delaying its discharge function. Thus, following the high-to-low transition in the DATA_ signal, transistor N500 will be on, while transistor N508 is off.

At time t5, the PHASE_ signal pulse terminates, returning the PHASE_ signal to the high level. Within the first phased pre-drive circuit 512, the output of gate G506 goes high, and transistor N508 is turned on. The first pre-drive node 516 is thus rapidly discharged to VSS, and transistor P504 is fully turned on. In this manner, in a high voltage mode, when the DATA signal transitions from a low level to a high level, transistor N508 is phased to turn on after transistor N500, thereby limiting the di/dt caused by the activation of transistor P504.

At time t6, the OE signal returns low, disabling the output buffer circuit 500. Within the first standard and phased pre-drive circuits (504 and 512) the output of gates G500 and G506 are driven low, and the first pre-drive node 516 is driven to the disabling (high) potential, turning off the first driver transistor P504. At the same time, within the second standard and phased pre-drive circuits (506 and 514) the output of gates G502 and G508 are driven high, and the second pre-drive node 518 is driven to its disabling (low) potential. The second driver transistor N504 is thus turned off, and the output driver circuit 508 is placed in the high impedance state.

Referring once again to FIG. 6 in conjunction with FIG. 5 the low voltage operation of the preferred embodiment 500 will be discussed. In the low voltage operation the HV/LV_ signal is low, essentially disabling the phase control circuit 510 by forcing the PHASE_ signal to remain high. With the PHASE_ signal high, gate G506 will have the same general response as gate G500. Similarly, gate G508 will have the same general response as gate G502. In this manner, in the low voltage mode of operation, the first standard and phased pre-drive circuits (504 and 512) drive their respective enabling transistors (N500 and N508) together in response to a low-to-high DATA signal transition. This is best shown by the comparing waveform G500 with the dashed portion of waveform G506. By discharging the first pre-drive node 516 essentially together (i.e., not phased) rapid enabling of transistor P504 can occur at low operating voltages when di/dt is not as much of a concern.

In the low voltage mode, the second standard and phased pre-drive circuits (506 and 514) function in a similar fashion to the first standard and phased pre-drive circuits (504 and 512). In a high-to-low DATA signal transition, rather than phase the turning on of the pre-drive transistors (P502 and P506), the transistors (P502 and P506) are turned on essentially together. In this manner transistor N504 is rapidly enabled at low operating voltages where di/dt concerns are not as significant.

While the various embodiments set forth herein illustrate output buffer circuits, the teachings of the embodiments can be applied to circuits internal to an integrated circuit where di/dt rates resulting from logic switching are of a concern. Furthermore, while the embodiment is implemented as a CMOS circuit, other technologies can benefit from the approaches described herein. Thus, it is understood that while the present invention has been described in terms of detailed preferred embodiments, various changes, substitutions, and alterations could be made without departing from the spirit and scope of the invention. Accordingly, the present invention is intended to be limited only as defined by the appended claims.

What is claimed is:

1. An output buffer circuit, comprising:

an input node that receives an input logic signal that varies between a first logic value and a second logic value;

an output node;

a first output drive device that couples the output node to a first drive voltage node in response to the potential at a first pre-drive node;

a first standard pre-drive circuit having a first controllable impedance path between the first pre-drive node and a first enable potential, the first controllable impedance path having a low impedance value when the input logic signal transitions from a first logic value to a second logic value;

a supply voltage indication node that receives a supply voltage indication signal that indicates at least a first operating voltage or a second operating voltage; and a first phased pre-drive circuit having a second controllable impedance path between the first pre-drive node and the first enable potential, the first controllable impedance path having a low impedance value when the first phased pre-drive circuit is enabled, the first phased pre-drive circuit being enabled when the input logic signal transitions from the first logic value to the second logic value and the supply voltage indication signal indicates the first operating voltage, and the first phased pre-drive circuit being enabled a predetermined delay after the input logic signal transitions from the first logic value to the second logic value when the supply voltage indication signal indicates the second operating voltage.

2. The output buffer of claim 1, wherein:

the first output drive device includes a p-channel insulated gate field effect transistor (IGFET) having a source-drain path coupled between the output node and the first drive voltage node.

3. The output buffer of claim 2, wherein:

the first standard pre-drive circuit includes a first n-channel pre-drive IGFET having a source-drain path coupled between the first pre-drive node and the first enable potential; and the first phased pre-drive circuit includes a first n-channel phased pre-drive IGFET having a source-drain path coupled between the first pre-drive node and the first enable potential.

4. The output buffer of claim 1, wherein:

the first standard pre-drive circuit includes a first pre-drive IGFET having a source-drain path coupled in series with an impedance device between the first pre-drive node and the first enable potential.

5. The output buffer of claim 1, wherein:

the first standard pre-drive circuit further includes a first disable impedance path disposed between the first pre-drive node and a first disable potential, the first disable impedance path having a relatively low impedance value when the input logic signal transitions from the second logic value to the first logic value.

6. The output buffer of claim 1, further including:

a second output drive device that couples the output node to a second drive voltage node in response to the potential at a second pre-drive node;

a second standard pre-drive circuit having a third controllable impedance path between the second pre-drive node and a second enable potential, the third controllable impedance path having a low impedance value when the input logic signal transitions from the second logic value to the first logic value;

a second phased pre-drive circuit having a fourth controllable impedance path between the second pre-drive node and the second enable potential, the fourth controllable impedance path having a low impedance value when the second phased pre-drive circuit is enabled, the second phased pre-drive circuit being enabled when the input logic signal transitions from the second logic value to the first logic value and the supply voltage indication signal indicates the first operating voltage, and the second phased pre-drive circuit being enabled a predetermined delay after the input logic signal transitions from the second logic value to the first logic value when the supply voltage indication signal indicates the second operating voltage.

7. The output buffer of claim 6, wherein:

the first output drive device is a p-channel IGFET and the first enabling potential is a low power supply voltage; and the second output drive device is an n-channel IGFET and the second enabling potential is a high power supply voltage.

8. The output buffer of claim 6, wherein:

the second standard pre-drive circuit further includes a second disable impedance path disposed between the second pre-drive node and a second disable potential, the second disable impedance path having a relatively low impedance value when the input logic signal transitions from the first logic value to the second logic value.

9. An output buffer that drives an output node in response to an input signal, the output buffer comprising:

an input node that receives the input signal;

a phase control circuit that receives the input signal and an operating voltage mode signal, the phase control circuit activating a disable signal for a predetermined period of time following a transition in the input signal when the operating voltage mode signal indicates a high operating voltage level;

a first standard pre-drive circuit coupled to the input node that drives a first pre-drive node according to the input signal;

a second standard pre-drive circuit coupled to the input node that drives a second pre-drive node according to the input signal;

a first phased pre-drive circuit coupled to the input node, the first phase pre-drive circuit driving the first pre-drive node according to the input signal when enabled, and being prevented from driving the first pre-drive node when disabled, the first phased pre-drive circuit being disabled when the disable signal is activated;

a first output driver device that drives an output node according to the potential at the first pre-drive node; and a second output driver device that drives the output node according to the potential at the second pre-drive node.

10. The output buffer of claim 9, wherein:

the phase control circuit includes a disable gate having at least two inputs and an output, the disable gate having one input that receives a disable signal and another input that receives the operating voltage mode signal, the disable gate driving its output according to the disable signal when the operating voltage mode signal indicates a high operating voltage level.

11. The output buffer of claim 10, wherein:

the phasing control circuit further includes a pulse generator circuit that generates a transition pulse at the occurrence of a transition in the input signal, the transition pulse being the disable signal.

12. The output buffer of claim 9, wherein:

the first standard pre-drive circuit includes a first pre-drive inverter having an input coupled to the input node; and the second standard pre-drive circuit includes a second pre-drive inverter having an input coupled to the input node.

13. The output buffer of claim 12, wherein:

the first standard pre-drive circuit drives the first pre-drive node through a first current limiting impedance device; and the second standard pre-drive circuit drives the second pre-drive node through a second current limiting impedance device.

14. The output buffer of claim 12, wherein:

the first standard pre-drive circuit is coupled to the input node by a first enable gate that receives an output enable signal, the first enable gate coupling the input signal to the first pre-drive inverter when the output enable signal has a first value, the first enable gate driving the first pre-drive inverter with a predetermined disable potential when the output enable signal has a second value.

15. The output buffer of claim 9, further including:

an input latch coupled to the input node that latches the value of the input signal.

16. An output driver circuit that reduces the rate at which current is drawn by the output driver circuit in a high voltage mode, the circuit comprising:

a first output driver transistor having a source-drain path coupled between a first drive voltage and an output node, and a gate coupled to a first pre-drive node;

a second output driver transistor having a source-drain path coupled between a second drive voltage and the output node, and a gate coupled to a second pre-drive node;

a first standard pre-drive transistor having a source-drain path coupled between the first pre-drive node and a first pre-drive potential;

a first phased pre-drive transistor having a source-drain path coupled between the first pre-drive node and the first pre-drive potential;

a second standard pre-drive transistor having a source-drain path coupled between the second pre-drive node and a second pre-drive potential;

a pre-drive control circuit having a standard mode and phased mode determinable by a supply voltage mode signal, in the standard mode, the pre-drive control circuit enabling the first standard pre-drive transistor and first phased pre-drive transistor substantially together in response to a first transition in the input data signal, and enabling the second standard pre-drive transistor in response to a second transition in the input data signal, and in the phased mode, the pre-drive control circuit enabling the first phased pre-drive transistor a predetermined delay after enabling the first standard pre-drive transistor in response to a first transition in the input data signal, and enabling the second standard pre-drive transistor in response to a second transition in the input data signal.

17. The output driver circuit of claim 16, wherein:

the pre-drive control circuit includes a first standard signal propagation path coupled between an input node that receives the input signal and the gate of the first standard pre-drive transistor, a first phased signal propagation path coupled between the input node and the gate of the first phased pre-drive transistor that receives a first supply voltage indication signal, the first phased signal propagation path including a delay circuit that delays the propagation of the input signal along the first phased signal propagation path when the first supply voltage indication signal indicates a high supply voltage, the delay circuit being disabled when the first supply voltage indication signal indicates a low supply voltage, and a second standard signal propagation path coupled between the input node and the gate of the second standard pre-drive transistor.

18. The output driver circuit of claim 17, wherein:

the first and second standard signal propagation paths both receive an output enable signal and are disabled when the output enable signal has a first value.

19. The output driver circuit of claim 16, further including:

a second phased pre-drive transistor having a source-drain path coupled between the second pre-drive node and the second pre-drive potential; and the pre-drive control circuit further including
in the standard mode, the pre-drive control circuit enabling the second phased pre-drive transistor substantially together with the second standard pre-drive transistor in response to a second transition in the input data signal, and in the phased mode, the pre-drive control circuit enabling the second phased pre-drive transistor a predetermined delay after enabling the second standard pre-drive transistor in response to second transition in the input data signal.

20. The output driver circuit of claim 16, wherein:

the source-drain path of the first standard pre-drive transistor is coupled to the first pre-drive node by a first impedance device, and the source-drain path of the second standard pre-drive transistor is coupled to the second pre-drive node by a second impedance device.

21. An output buffer that drives an output node in response to an input signal, the output buffer comprising:

an input node that receives the input signal;

a phase control circuit that recieves the input signal and an operating voltage mode signal, the phase control circuit activating a disable signal for a predetermined period of time following a transition in the input signal when the operating voltage mode signal indicates a high voltage level;

a first standard pre-drive circuit coupled to the input node that drives a first pre-drive node according to the input signal;

a second standard pre-drive circuit coupled to the input node that drives a second pre-drive node according to the input signal;

a first phased pre-drive circuit coupled to the input node, the phase pre-drive circuit driving the first pre-drive node according to the input signal when enabled, and being prevented from driving the first pre-drive node when disabled, the first phased pre-drive circuit being disabled when the disable signal is activated;

a first output driver devise that drives an output node according to the potential at the first pre-drive node; and a second output driver device the drives the output node according to the potential at the second pre-drive node;

wherein the phase control circuit includes a disable gate having at least two inputs and an output, the disable gate having one input that receives a disable signal and another input that receives the operating voltage mode signal, the disable gate driving its output according to the disable signal when the operating voltage mode signal indicates a high operating voltage level; and wherein the phasing control circuit further includes a pulse generator circuit that generates a transition pulse at the occurrence of a transition in the input signal, the transition pulse being the disable signal.

* * * * *